(12) United States Patent
Lee et al.

(10) Patent No.: US 8,848,756 B2
(45) Date of Patent: Sep. 30, 2014

(54) SURFACE PLASMON LASER

(71) Applicant: Samsung Electronics Co., Ltd., Suwon-si (KR)

(72) Inventors: Jae-soong Lee, Suwon-si (KR); Un-jeong Kim, Hwaseong-si (KR); Young-geun Roh, Seoul (KR); Yeon-sang Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 88 days.

(21) Appl. No.: 13/621,420

(22) Filed: Sep. 17, 2012

(65) Prior Publication Data

US 2013/0070799 A1 Mar. 21, 2013

(30) Foreign Application Priority Data

Sep. 16, 2011 (KR) .......................... 10-2011-0093643
Sep. 13, 2012 (KR) .......................... 10-2012-0101625

(51) Int. Cl.
| | | |
|---|---|---|
| *H01S 5/00* | (2006.01) | |
| *H01S 3/08* | (2006.01) | |
| *H01S 3/083* | (2006.01) | |
| *G02B 6/122* | (2006.01) | |
| *H01S 5/10* | (2006.01) | |
| *H01S 5/026* | (2006.01) | |
| *H01S 5/34* | (2006.01) | |

(52) U.S. Cl.
CPC ............ *H01S 5/1046* (2013.01); *H01S 5/1075* (2013.01); *H01S 5/026* (2013.01); *G02B 6/1226* (2013.01); *H01S 5/3412* (2013.01)
USPC ........................... 372/45.01; 372/94; 372/108

(58) Field of Classification Search
USPC .................................. 372/19, 45.01, 94, 108
See application file for complete search history.

(56) References Cited

U.S. PATENT DOCUMENTS

| | | | | |
|---|---|---|---|---|
| 5,343,490 | A * | 8/1994 | McCall | 372/94 |
| 5,790,583 | A * | 8/1998 | Ho | 372/92 |
| 6,501,783 | B1 | 12/2002 | Capasso et al. | |
| 7,242,705 | B2 * | 7/2007 | Kneissl et al. | 372/67 |
| 2005/0226591 | A1 * | 10/2005 | Gardner et al. | 385/147 |
| 2008/0204709 | A1 * | 8/2008 | Kiesel et al. | 356/36 |

OTHER PUBLICATIONS

Kurniawan, et al., "Surface Plasmon Hybridization of Whispering Gallery Mode Microdisk Laser", Photonics Global Conference 2010, Singapore, Dec. 14-16, 2010.*
Perahia, et al., "Surface-plasmon mode hybridization in subwavelength microdisk lasers", Applied Physics Letters, 2009, 3 pgs total.
Kurniawan, et al., "Surface Plasmon Hybridization of Whispering Gallery Mode Microdisk Laser", Photonics Global Conference 2010, Singapore, Dec. 14-16, 2010, 4 pgs total.

(Continued)

*Primary Examiner* — Armando Rodriguez
(74) *Attorney, Agent, or Firm* — Sughrue Mion, PLLC

(57) ABSTRACT

A surface plasmon laser includes a metal layer, a gain medium layer provided on the metal layer and having a circular structure portion in which a whispering gallery mode is generated in which surface plasmon light generated due to surface plasmon resonance on an interface with the metal layer rotates along a circle, and a deformed portion formed to output part of laser light generated in the circular structure portion of the gain medium layer.

16 Claims, 5 Drawing Sheets

(56) References Cited

OTHER PUBLICATIONS

Kurniawan, et al., "Generation of Surface Plasmon Polariton Using Plasmonic Resonant Cavity Based on Microdisk Laser", IEEE Photonics Journal, vol. 3, Issue 3, pp. 344-352, 2011, 9 pgs total.

Chen, et al., "Analysis of Surface Plasmon Guided Sub-Wavelength Microdisk Cavity", 2008, IEEE, pp. 320-321.

A.V. Akimov, et al., "Generation of single optical plasmons in metallic nanowires coupled to quantum dots", Nature, Letters, Nov. 15, 2007, pp. 402-406, vol. 450, Nature Publishing Group.

Bumki Min et al., "High-Q surface-plasmon-polariton whispering-gallery microcavity", Nature, Letters, Jan. 22, 2009, pp. 455-459, vol. 457, Macmillan Publishers Limited.

Oliver Benson, "Assembly of hybrid photonic architectures from nanophotonic constituents", Nature, Review, Dec. 8, 2011, pp. 193-199, vol. 480 Macmillan Publishers Ltd.

P. Michler, et al., "A Quantum Dot Single-Photon Turnstile Device", Science Magazine, Dec. 22, 2000, pp. 2282-2285, vol. 290.

Volker J. Sorger, et al., "Plasmonic Fabry-Pérot Nanocavity", Nano Letters, Aug. 12, 2009, pp. 3489-3493, vol. 9, No. 10, American Chemical Society.

Soon-Hong Kwon, et al., "Subwavelength plasmonic lasing from a semiconductor nanodisk with silver nanopan cavity", Nano Letters, Aug. 12, 2010, pp. 3679-3683, vol. 10, American Chemical Society.

Kerry J. Vahala, "Optical microcavities", Nature, Insight Review Articles, Aug. 14, 2003, pp. 839-846, vol. 424, Nature Publishing Group.

\* cited by examiner

US 8,848,756 B2

SURFACE PLASMON LASER

CROSS-REFERENCE TO RELATED APPLICATIONS

This application claims priority from Korean Patent Application No. 10-2011-0093643 filed Sep. 16, 2011, and Korean Patent Application No. 10-2012-0101625 filed Sep. 13, 2012, the disclosures of which are incorporated herein in their entirety by reference.

BACKGROUND

1. Field

Embodiments relates to a laser, and more particularly, to a surface plasmon laser for oscillating laser light by using a surface plasmon resonance phenomenon.

2. Description of the Related Art

In general, optical integrated circuits are optical circuits on which various optical elements perform various operations such as light emission, optical detection, optical amplification, and optical modulation on a single substrate. For example, a light source, a photodetector, an optical waveguide, a lens, a grating, and an optical switch may be integrated on a single substrate. An optical integrated circuit may be diversely applied to devices in various fields, for example, an optical recording/reproduction apparatus, an optical communication apparatus, a display apparatus, and an optical computer.

A laser is mainly used as a light source in an optical integrated circuit. Various types of lasers have been developed according to an output, an oscillation wavelength, and an oscillation method. To increase a degree of integration of an optical integrated circuit, the size of a light spot of a laser beam emitted by a laser should be formed to be very tiny, for example, less than or equal to 1 μm. Also, a laser device should be formed to be small. However, there is a limit in the size of a small light spot in the lasers suggested thus far due to a limit in diffraction. Accordingly, efforts to develop a laser having a new structure that can overcome the limit in diffraction of a laser have been increased.

SUMMARY

Provided is a surface plasmon laser capable of outputting a laser beam having a small size beyond a limit in diffraction of a laser.

Additional aspects will be set forth in part in the description which follows and, in part, will be apparent from the description, or may be learned by practice of the presented embodiments.

According to an aspect of an exemplary embodiment, a surface plasmon laser includes a metal layer, a gain medium layer provided on the metal layer and having a circular structure portion in which a whispering gallery mode is generated in which surface plasmon light generated due to surface plasmon resonance on an interface with the metal layer rotates along a circle, and a deformed portion formed to output part of laser light generated in the circular structure portion of the gain medium layer.

The deformed portion may be formed on a same plane as the circular structure portion of the gain medium layer.

The deformed portion may include a notch that is provided at one side of the gain medium layer and through which the laser light is output from the gain medium layer.

The deformed portion may include a partially circular structure having a part connected to the circular structure portion of the gain medium layer and the laser light may be output through a cut surface of the partially circular structure.

The partially circular structure may be formed on a same layer as the gain medium layer.

The deformed portion may be a protruding guide extending in a tangential direction of the circular structure portion of the gain medium layer.

The deformed portion may be a recessed portion that is formed in a recess at one side of the gain medium layer.

The deformed portion may include a ring type structure arranged to contact the circular structure portion of the gain medium layer, and a protruding guide extending in a tangential direction at one side of the ring type structure.

The ring type structure and the protruding guide may be formed on a same layer as the gain medium layer.

The circular structure portion of the gain medium layer may be formed in a ring type structure.

The gain medium layer may include indium phosphide (InP).

The gain medium layer may include a plurality of quantum dots.

The surface plasmon laser may further include a light guide for guiding the laser light that is provided at an outlet of the laser light of the deformed portion.

The light guide may include a metallic nanotube or nanorod.

The surface plasmon laser may further include a metal film coated with a metallic material that is provided at on least part of an outer circumferential surface of the circular structure portion of the gain medium layer.

The surface plasmon laser may further include a metal film coated with a metallic material that is provided at on least part of an outer circumferential surface of the circular structure portion of the gain medium layer.

The metal layer may be formed as a two-dimensional plane to be used as a waveguide plane of the laser light externally output from the gain medium layer through the deformed portion, and the gain medium layer may be disposed in a partial area of the metal layer forming the two-dimensional plane.

As surface plasmon light is generated due to surface plasmon resonance, a laser beam having a small size beyond a laser diffraction limit may be output.

Also, since laser light proceeds in one direction by slightly deforming a nanodisc and by using a whispering gallery mode obtained from the shape of the nanodisc, a quality laser light may be obtained from a nano-sized structure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
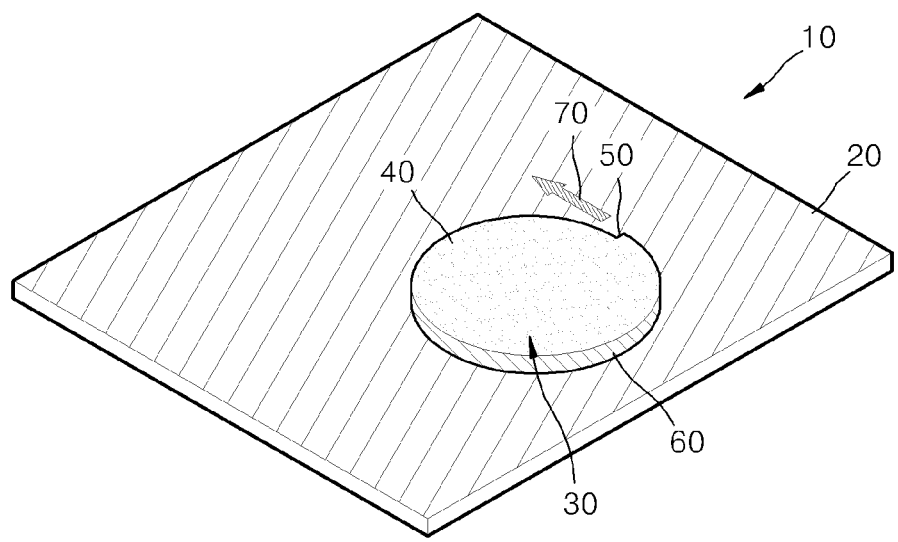
FIG. 1 is a perspective view schematically illustrating a surface plasmon laser according to an exemplary embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

A surface plasmon laser according to exemplary embodiments is formed to embody a surface plasmon laser of a whispering gallery mode type in which surface plasmon light generated due to surface plasmon resonance rotates along a circle. To this end, the surface plasmon laser according to exemplary embodiments uses a whispering gallery mode obtained from the shape of a nanodisc. When a laser beam is irradiated in one direction by slightly deforming the nanodisc, laser light of a good quality may be obtained from a structure having a nano size.

A simple nanodisc shape may produce a quality laser due to its relatively simple shape. However, in this case, it may be difficult to enable laser light to proceed to the outside from a cavity. To address this matter, in the surface plasmon laser according to exemplary embodiments, a substantially circular-shaped nanodisc is slightly deformed to allow laser light to easily escape from the nanodisc so that a quality laser light may be easily used. In the surface plasmon laser according to exemplary embodiments, to guide the laser light irradiated from the nanodisc, a two-dimensional plane is used as a waveguide plane or a one-dimensional waveguide pipe such as a metal nanotube or a metal nanorod is used, and thus a unit device with a waveguide integrated structure may be embodied.

The surface plasmon laser according to exemplary embodiments is described in detail with reference to the accompanying drawings. In the drawings, like reference numerals denote like constituent elements and the size of each constituent element may be exaggerated for clarity and convenience of explanation.

Figure 2A:
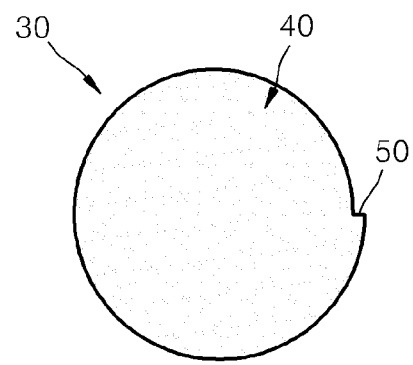
FIGS. 2A and 2B are plan views illustrating a gain medium layer applicable to the surface plasmon laser of FIG. 1.
Figure 2B:
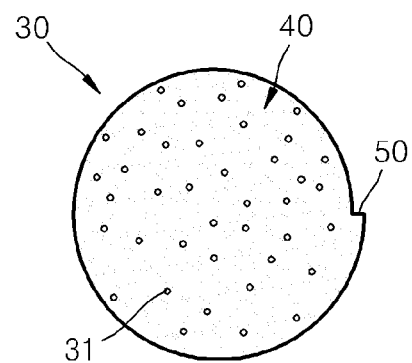
Figure 3:
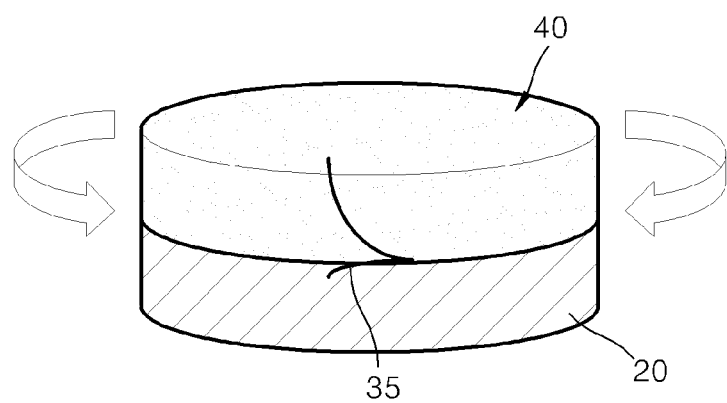
FIG. 3 schematically illustrates a whispering gallery mode generated in the surface plasmon laser of FIG. 1.

FIG. 1 is a perspective view schematically illustrating a surface plasmon laser 10 according to an exemplary embodiment. FIGS. 2A and 2B are plan views illustrating a gain medium layer 30 applicable to the surface plasmon laser 10 of FIG. 1. FIG. 3 schematically illustrates a whispering gallery mode generated in the surface plasmon laser 10 of FIG. 1. In FIG. 3, only a metal layer portion corresponding to the gain medium layer 30 is illustrated for convenience of explanation.

Referring to FIGS. 1-3, the surface plasmon laser 10 according to the exemplary embodiment includes a metal layer 20 and the gain medium layer 30 provided on the metal layer 20. The metal layer 20 generates surface plasmon resonance on an interface with the gain medium layer 30. For example, the metal layer 20 may be formed of a material such as silver (Ag) or gold (Au), which may easily generate surface plasmon resonance. Also, graphene exhibiting metallicity may be used as the metal layer 20. In addition, metal such as copper (Cu), lead (Pb), indium (In), tin (Sn), and cadmium (Cd) may be used as the metal layer 20.

The metal layer 20 may be formed as a two-dimensional plane to be used as a waveguide surface of the laser light when the laser light is induced from surface plasmon light generated due to surface plasmon resonance on an interface with the gain medium layer 30 and is output from the gain medium layer 30 to the outside. The gain medium layer 30 may be located in a partial area of the metal layer 20 forming the two-dimensional plane. Alternatively, the metal layer 20 is located only on a bottom surface of the gain medium layer 30 and a two-dimensional plane used as the waveguide surface of the laser light output from the gain medium layer 30 may be formed to exist in an area other than the metal layer 20. The two-dimensional plane may be formed of, for example, a metal material or graphene to have metallicity for waveguiding laser light.

FIGS. 2A and 2B are plan views illustrating the gain medium layer 30 applicable to the surface plasmon laser 10 of FIG. 1. FIG. 2A illustrates an exemplary embodiment of the gain medium layer 30 and FIG. 2B illustrates another exemplary embodiment of the gain medium layer 30.

Referring to FIGS. 2A and 2B, the gain medium layer 30 is a layer to perform stimulated emission of light and amplify the light. The gain medium layer 30 is provided on the metal layer 20 and generates surface plasmon light due to surface plasmon resonance on an interface with the metal layer 20. The gain medium layer 30 may include, for example, indium phosphide (InP). The gain medium layer 30 has a circular structure portion 40 to form a whispering gallery mode in which surface plasmon light 35 generated due to surface plasmon resonance on the interface with the metal layer 20 rotates along a circle as illustrated in FIG. 3.

In other words, to form a whispering gallery mode, at least a cavity of the gain medium layer 30 is configured so that a portion where amplification is performed may be formed in a nanodisc shape. Laser oscillation is performed in the whispering gallery mode obtained from the nanodisc. When laser oscillation is performed in the whispering gallery mode, the surface plasmon light 35 that is generated may rotate in both of the opposite directions. Alternatively, since laser light that is output from the exemplary embodiments shown in FIGS. 1, 2A and 2B, and FIGS. 4-7 and described below, is the surface plasmon light 35 that rotates in one direction, a unidirectional surface plasmon laser may be embodied. Also, in the exemplary embodiment shown in FIG. 8 that is described below, although the surface plasmon light 35 that rotates in the opposite directions are output, a unidirectional surface plasmon layer may be embodied in which output laser lights proceed in one direction. FIG. 3 illustrates a case in which the surface plasmon light 35 rotates in both of the opposite directions.

The gain medium layer 30 may be formed to include a plurality of quantum dots 31, as illustrated in FIG. 2B. The quantum dots 31 are semiconductor materials having a crystal structure of several nanometer size that is smaller than the radius of a Bohr exciton. Although many electrons exist in the quantum dots 31, the number of free electrons may be limited to about 1 to 100. As a result, the energy levels of electrons in the quantum dots 31 become discontinuous. Accordingly, the quantum dots 31 may have electric and optical properties different from those of a semiconductor in a bulk state forming a continuous band. For example, since the energy levels of the quantum dots 31 vary according to the sizes of the quantum dots 31, a bandgap may be adjusted by simply changing the sizes of the quantum dots 31. In other words, mere adjustment of the sizes of the quantum dots 31 enables a user to adjust a wavelength of emitted light with ease. Also, since the quantum dots 31 have high gain, laser oscillation is possible even when a relatively large light loss is generated due to the metal layer 20. In other words, when the quantum dots 31 having high efficiency gain are used in the gain medium layer 30, the gain by the quantum dots 31 may be greater than the loss by the metal layer 20 so that optical amplification is made possible.

FIG. 2B illustrates a case in which the gain medium layer 30 includes the quantum dots 31 as compared to FIG. 2A. The physical characteristics of the gain medium layer 30 of FIGS. 2A and 2B may be applied to any of FIGS. 1 and 3-8. The gain medium layer 30 including the quantum dots 31 may be formed of the quantum dots 31 only or may have a structure in which the quantum dots 31 are further added to a gain medium that can generate surface plasmon light due to surface plasmon resonance on an interface with the metal layer 20, such as, for example, InP. Also, FIG. 2B illustrates that the quantum dots 31 are entirely included in the gain medium layer 30. Alternatively, the quantum dots 31 may be included in only a partial area of the gain medium layer 30.

The gain medium layer 30 is a layer to perform stimulated emission of light and amplify the light and is provided on the metal layer 20. The gain medium layer 30 generates surface plasmon light due to surface plasmon resonance on the interface with the metal layer 20. The gain medium layer 30 may include, for example, InP.

A metal film 60 of a metallic material may be further provided on at least a part of an outer circumferential surface of the circular structure portion 40. The metal film 60 may be formed of a metal material, such as, for example, silver.

A deformed portion is provided at one side of the circular structure portion 40 of the gain medium layer 30 so that part of the laser light generated from the circular structure portion 40 may be output through the deformed portion. In other words, the deformed portion may be provided by slightly deforming a nanodisc so that the laser light proceeds in one direction. The deformed portion may be formed on the same plane as the circular structure portion 40 of the gain medium layer 30. The deformed portion may be provided in various ways, including, for example, as illustrated in FIGS. 2A and 2B and FIGS. 5-8 that are described below. FIGS. 2A, 2B, and 5-8 are plan views illustrating cavities to obtain the surface plasmon laser 10 by slightly deforming a circular nanodisc.

As illustrated in FIGS. 1, 2A, and 2B, the deformed portion may be a notch 50, for example, a cut surface with respect to a tangential direction of the circular structure portion 40, that is formed at one side of the gain medium layer 30 so that the laser light may be output from a circular cavity of the gain medium layer 30. When the laser light rotating along a circle arrives at the portion where the notch 50 is formed, part of the laser light is output to the outside through the notch 50. The laser light proceeds substantially in a tangential direction of the circular structure portion 40 or a direction close to the tangential direction. The output laser light may be waveguided along a two-dimensional plane formed by the metal layer 20 (or a metallic two-dimensional plane on the same plane as the metal layer 20 when the metal layer 20 is formed only on the bottom surface of the gain medium layer 30).

In the operation of the surface plasmon laser 10 according to the embodiment, first, excitation light is incident on the gain medium layer 30 of the surface plasmon laser 10. The excitation light may have a wavelength shorter than an oscillation wavelength of the surface plasmon laser 10. For example, when the oscillation wavelength of the surface plasmon laser 10 is designed to be a wavelength in a blue range, the excitation light may have a wavelength in an ultraviolet range. Also, when the oscillation wavelength of the surface plasmon laser 10 is designed to be a wavelength in a red range, the excitation light may have a wavelength in a blue range. Then, the gain medium layer 30 formed of the quantum dots 31, for example, is excited by the excitation light and thus light of a particular wavelength is generated. The wavelength of the light generated from the gain medium layer 30 may be the same as the oscillation wavelength of the surface plasmon laser 10.

The light generated from the gain medium layer 30 generates surface plasmon resonance on the interface between the gain medium layer 30 and the metal layer 20. The surface plasmon is a surface electromagnetic wave (that is, light) generated on the interface between a metal film and a dielectric. It is known that the surface plasmon is generated by charge density oscillation of electrons on a surface of the metal film when light of a particular wavelength is incident on the metal film. The light generated due to the surface plasmon resonance is an evanescent wave having a very strong intensity but a short effective distance. The wavelength of light to generate the surface plasmon resonance may vary according to a material of the metal film and a refractive index of the dielectric, for example. For example, the material of the metal layer 20 and the refractive index of the gain medium layer 30 may be selected so that surface plasmon resonance is generated by the wavelength of the light generated from the gain medium layer 30.

The gain medium layer 30 is formed such that surface plasmon light rotates along a circle in a whispering gallery mode and thus the surface plasmon light stays within the gain medium layer 30. Thus, gain of the surface plasmon laser 10 may increase, and thus light may be amplified. The amplified surface plasmon light is laser light that is output from the deformed portion, for example, the notch 50, of the surface plasmon laser 10 and proceeds in the tangential direction of the circular structure portion 40 of the gain medium layer 30 or a direction close to the tangential direction. In FIG. 1, reference numeral 70 denotes surface plasmon laser light that is output through the notch 50.

When the surface plasmon laser 10 having a circular nanodisc is formed, the surface plasmon laser light continuously remains in the cavity. As in the above-described exemplary embodiment, when the circular cavity is slightly deformed, the laser light may be output through a deformed portion rather than staying in the cavity and thus an output efficiency of the laser light may be improved.

To use the surface plasmon laser light 70 output from the cavity through the deformed portion of the gain medium layer 30, a propagation structure for propagating the surface plasmon laser light 70 is required. As in FIG. 1, when the two-dimensional plane, for example, the metal layer 20, is formed of a metal material such as silver, or graphene, to thus have metallicity, the surface plasmon laser light 70 output from the gain medium layer 30 may be propagated through the two-dimensional waveguide plane and thus the surface plasmon laser light 70 may be propagated along a plane to another device provided on the same plane. The two-dimensional plane used as the waveguide plane may be used as an electric injection layer.

In the above-description, the surface plasmon laser 10 according to the exemplary embodiment uses a two-dimensional plane as the waveguide plane, but other exemplary embodiments are not limited thereto. For example, instead of using the two-dimensional plane as the waveguide plane, to guide the laser light output from the gain medium layer 30 through the deformed portion to proceed in a desired direction with more ease, as illustrated in FIG. 4, a light guide 80 may be separately provided at a laser light outlet of the deformed portion as a one-dimensional waveguide for guiding the laser light.

Figure 4:
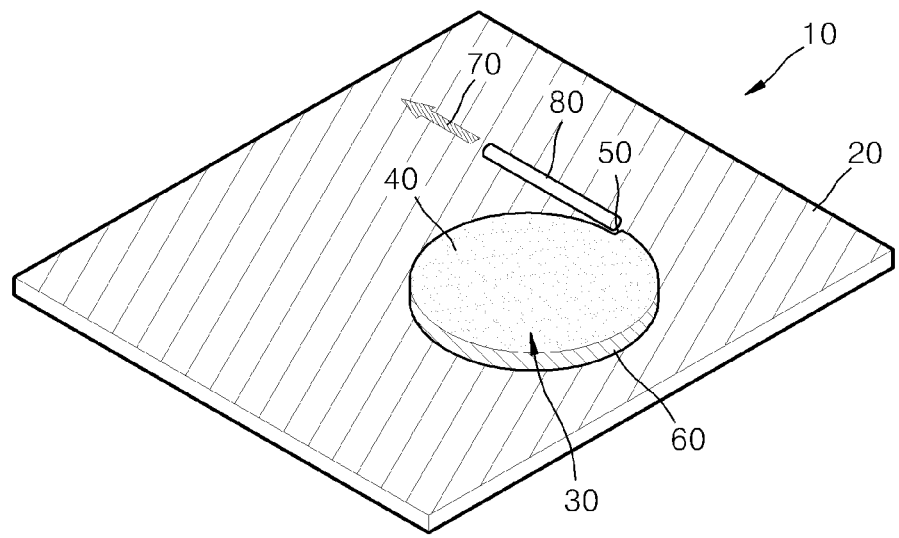
FIG. 4 is a perspective view schematically illustrating a surface plasmon laser according to another exemplary embodiment.

Referring to FIG. 4, when the gain medium layer 30 includes a deformed portion that is the notch 50, the light guide 80 is arranged close to the notch 50. The light guide 80 may be arranged on the two-dimensional plane, for example, the metal layer 20. A metallic nanotube or nanorod may, for example, be used as the light guide 80. In other words, a metallic nanotube or nanorod may be integrated at a position where laser light is output. Alternatively, when the light guide 80 is an engraved structure having a nanorod shape, metal may cover the cavity. In this case, the metal is removed as much as the nanorod shape by using, for example, focused ion beam (FIB) equipment, and thus a path to propagate the laser light is formed, thereby forming a desired unit device.

Since the light guide 80 forms a one-dimensional waveguide, a unit device of the surface plasmon laser 10 integrated with the one-dimensional waveguide may be embodied.

The light guide 80 in the form of a one-dimensional waveguide as illustrated in FIG. 4 may be arranged at the laser light outlet of the deformed portion with respect to a structure having a variety of deformed portions as illustrated in FIGS. 5-8, which are described below. Since such examples are sufficiently analogized with reference to FIG. 4, illustrations of common elements are omitted herein.

A variety of examples of the surface plasmon laser 10 according to exemplary embodiments are described below with reference to FIGS. 5-8. FIGS. 5-8 illustrate a variety of examples of the deformed portion formed by slightly deforming the gain medium layer 30 formed in a nanodisc shape and having the circular structure portion 40 and a laser light output end of the gain medium layer 30. The various deformed portions of FIGS. 5-8 are formed on the same plane as the circular structure portion 40 of the gain medium layer 30.

Figure 5:
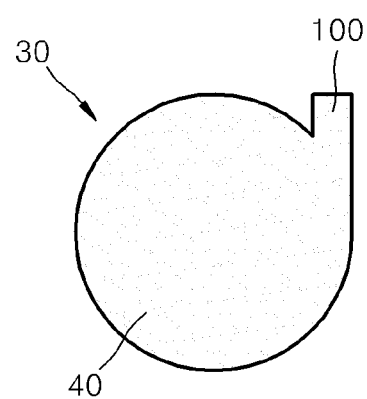
FIGS. 5 through 8 illustrate a variety of surface plasmon lasers according to various exemplary embodiments.

Referring to FIG. 5, the deformed portion may be formed in the form of a protruding guide 100 extending in a tangential direction of the circular structure portion 40 of the gain medium layer 30 or a direction close to the tangential direction.

Figure 6:
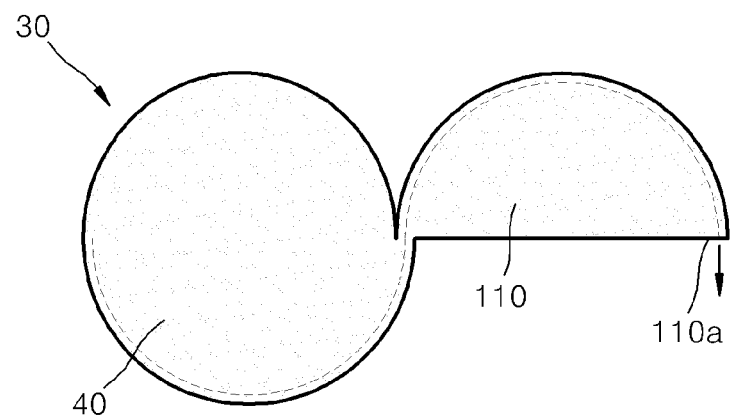

Referring to FIG. 6, the deformed portion may be formed, for example, in a partially circular structure 110, that is, a semicircular structure having a part connected to the circular structure portion 40 of the gain medium layer 30. In this case, part of the laser light rotating along a circle in the circular structure portion 40 of the gain medium layer 30 is output through a connection part, that is, the notch of the circular structure portion 40 to enter the partially circular structure 110. The laser light rotates along a circle in the partially circular structure 110 and then is output through a cut surface 110a of the partially circular structure 110. The partially circular structure 110 may be formed on the same layer as the gain medium layer 30. A dotted line in FIG. 6 schematically indicates a path of the light output through the partially circular structure 110.

Figure 7:
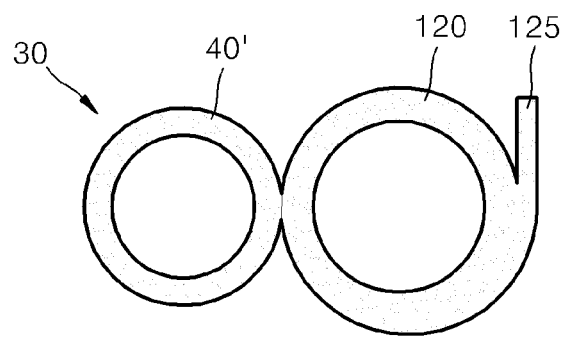

Referring to FIG. 7, the deformed portion may include a ring type structure 120 arranged to contact the circular structure portion 40 of the gain medium layer 30 and a protruding guide 125 formed at one side of the ring type structure 120 and extending in a tangential direction or a direction close to the tangential direction. Also, the ring type structure 120 and the protruding guide 125 may be formed on the same layer as the gain medium layer 30. In this case, although the circular structure portion 40 of the gain medium layer 30 may be formed in a ring type structure 40' as illustrated in FIG. 7, other exemplary embodiments are not limited thereto and the circular structure portion 40 may be formed, for example, in a nanodisc as described above in the other exemplary embodiments.

Figure 8:
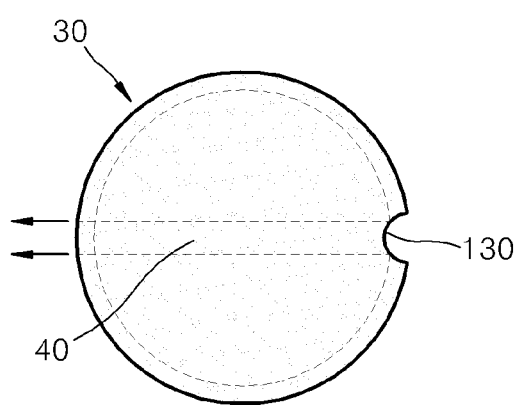

Referring to FIG. 8, the deformed portion may be a recessed portion 130 formed at a circumferential side surface of the circular structure portion 40 of the gain medium layer 30. When the laser light rotating along a circle meets the recessed portion 130, the laser light is reflected by an interface between the gain medium layer 30 and the recessed portion 130 to be output from the gain medium layer 30. FIG. 8 illustrates an example of a path of the laser light reflected by the interface of the recessed portion 130. As described above, the laser lights rotating along a circle in the opposite directions are reflected by the recessed portion 130 and may proceed in the same direction.

As described above, to guide the laser light output from the gain medium layer 30 in the form of a nanodisc, when a two-dimensional metal plane coated with graphene, etc., for example, the metal layer 20, is used as a large waveguide plane or a one-dimensional waveguide is formed by using the light guide 80 formed of a metallic nanotube or nanorod, a structure to guide and transmit the laser light generated from the surface plasmon laser 10 may be easily embodied and thus a unit device that is a core part in forming an optoelectronic integrated circuit (OEIC) may be embodied.

In the surface plasmon laser 10 according to exemplary embodiments, an output efficiency of surface plasmon laser light from the cavity may be improved so that transfer of the laser light between the cavity and another plasmon device may be performed with ease. Thus, the surface plasmon laser 10 having a high Q factor may be manufactured in a simple structure. Also, as a structure to propagate the laser light is integrated according to the exemplary embodiments, the implementation of optoelectronic integrated circuits may be facilitated.

Furthermore, in the surface plasmon laser 10 according to exemplary embodiments, since the metal layer 20 may function as a substrate, integration in an optical integrated circuit may be further facilitated.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A surface plasmon laser comprising:
   a metal layer;
   a gain medium layer provided on the metal layer, the gain medium layer comprising a circular structure portion in which a whispering gallery mode is generated in which surface plasmon light generated due to surface plasmon resonance on an interface with the metal layer rotates along a circle; and
   a deformed portion formed to output part of laser light generated in the circular structure portion of the gain medium layer,
   wherein the deformed portion comprises a partially circular structure having a part connected to the circular structure portion of the gain medium layer and the laser light is output through a cut surface of the partially circular structure.

2. The surface plasmon laser of claim 1, wherein the deformed portion and the circular structure portion are disposed on a same plane.

3. The surface plasmon laser of claim 1, wherein the partially circular structure and the circular structure portion of the gain medium layer are disposed on a same plane of the metal layer.

4. A surface plasmon laser comprising:
a metal layer;
a gain medium layer provided on the metal layer, the gain medium layer comprising a circular structure portion in which a whispering gallery mode is generated in which surface plasmon light generated due to surface plasmon resonance on an interface with the metal layer rotates along a circle; and
a deformed portion formed to output part of laser light generated in the circular structure portion of the gain medium layer,
wherein the deformed portion comprises:
a ring type structure arranged to contact the circular structure portion of the gain medium layer; and
a protruding guide extending from one side of the ring type structure in a tangential direction of the ring type structure.

5. The surface plasmon laser of claim 4, wherein the ring type structure, the protruding guide and the gain medium layer are disposed on a same plane of the metal layer.

6. The surface plasmon laser of claim 4, wherein the circular structure portion of the gain medium layer is a ring type structure.

7. The surface plasmon laser of claim 1, wherein the gain medium layer comprises indium phosphide.

8. The surface plasmon laser of claim 1, wherein the gain medium layer comprises a plurality of quantum dots.

9. The surface plasmon laser of claim 1, further comprising a light guide for guiding the laser light that is provided at an outlet of the laser light of the deformed portion.

10. The surface plasmon laser of claim 9, wherein the light guide comprises a metallic nanotube or nanorod.

11. The surface plasmon laser of claim 9, further comprising a metal film that is provided on at least part of an outer circumferential surface of the circular structure portion of the gain medium layer.

12. The surface plasmon laser of claim 1, further comprising a metal film that is provided on at least part of an outer circumferential surface of the circular structure portion of the gain medium layer.

13. The surface plasmon laser of claim 1, wherein the metal layer is formed as a two-dimensional plane configured as a waveguide plane of the laser light externally output from the gain medium layer through the deformed portion, and the gain medium layer is disposed in a partial area of the metal layer forming the two-dimensional plane.

14. The surface plasmon laser of claim 4, wherein the deformed portion and the circular structure portion are disposed on a same plane.

15. The surface plasmon laser of claim 4, wherein the gain medium layer comprises indium phosphide or a plurality of quantum dots.

16. The surface plasmon laser of claim 4, further comprising a light guide for guiding the laser light that is provided at an outlet of the laser light of the deformed portion.

* * * * *